(12) United States Patent
Inahashi (10) Patent No.: US 6,790,116 B2
(45) Date of Patent: Sep. 14, 2004

(54) RADIO COMMUNICATION APPARATUS AND RADIO FREQUENCY CORRECTING METHOD

(75) Inventor: Atusi Inahashi, Saitama (JP)

(73) Assignee: NEC Corporation, Tokyo (JP)

( * ) Notice: Subject to any disclaimer, the term of this patent is extended or adjusted under 35 U.S.C. 154(b) by 700 days.

(21) Appl. No.: 09/824,784

(22) Filed: Apr. 4, 2001

(65) Prior Publication Data

US 2001/0029171 A1 Oct. 11, 2001

(30) Foreign Application Priority Data

Apr. 5, 2000 (JP) ........................................ 2000-102945

(51) Int. Cl.[7] ................................................ H04B 1/04
(52) U.S. Cl. .................... 445/118; 455/67.14; 455/208; 455/214
(58) Field of Search .................. 455/118, 42, 67.11, 455/67.13, 67.14, 703, 114.2, 136, 148, 205, 208, 214

(56) References Cited

U.S. PATENT DOCUMENTS

| | | | | |
|---|---|---|---|---|
| 3,798,553 A | * | 3/1974 | Sakamoto | ................ 455/167.1 |
| 4,031,317 A | | 6/1977 | McClain et al. | |
| 4,077,008 A | * | 2/1978 | Rast et al. | .................. 455/259 |
| 4,163,943 A | * | 8/1979 | Miki et al. | ................ 455/158.3 |
| 5,115,515 A | | 5/1992 | Yamamoto et al. | |
| 5,390,348 A | * | 2/1995 | Magin et al. | ............... 455/63.1 |

FOREIGN PATENT DOCUMENTS

| | | |
|---|---|---|
| JP | 2-283149 | 11/1990 |
| JP | 4-22241 | 1/1992 |
| JP | 4-27636 | 3/1992 |
| JP | 4-260254 | 9/1992 |
| JP | 5-268282 | 10/1993 |
| JP | 6-261082 | 9/1994 |
| JP | 8-8983 | 1/1996 |
| JP | 10-13256 | 1/1998 |

* cited by examiner

Primary Examiner—Tony T. Nguyen
(74) Attorney, Agent, or Firm—Whitham, Curtis & Christofferson, PC (57) ABSTRACT

To ensure frequency stability of a radio frequency in a radio communication apparatus for generating the radio frequency synchronizing with a transmission path frequency of digital data transmitted from a wire digital transmission path and so on. Concerning influence of a difference of a transmission path frequency that obstructs stability of a radio carrier frequency, the difference of a transmission path frequency 12b is compared with a high-stability radio reference clock 22a, the difference frequency 17a is detected by a counter 71, and frequency offset of a radio-station-transmission signal of a local oscillator 61 is made on the basis of the differential frequency. By the operation, the influence of the difference of the transmission path frequency that obstructs the stability of the radio carrier frequency 63a can be compensated.

10 Claims, 6 Drawing Sheets

RADIO COMMUNICATION APPARATUS AND RADIO FREQUENCY CORRECTING METHOD

FIELD OF THE INVENTION

The present invention relates to a radio communication apparatus and radio frequency correcting method thereof, and more particularly to a radio frequency correcting method for a radio communication system for producing a radio frequency synchronizing with a transmission path frequency of digital data transmitted from a wire digital transmission path and so on.

BACKGROUND OF THE INVENTION

Figure 7:
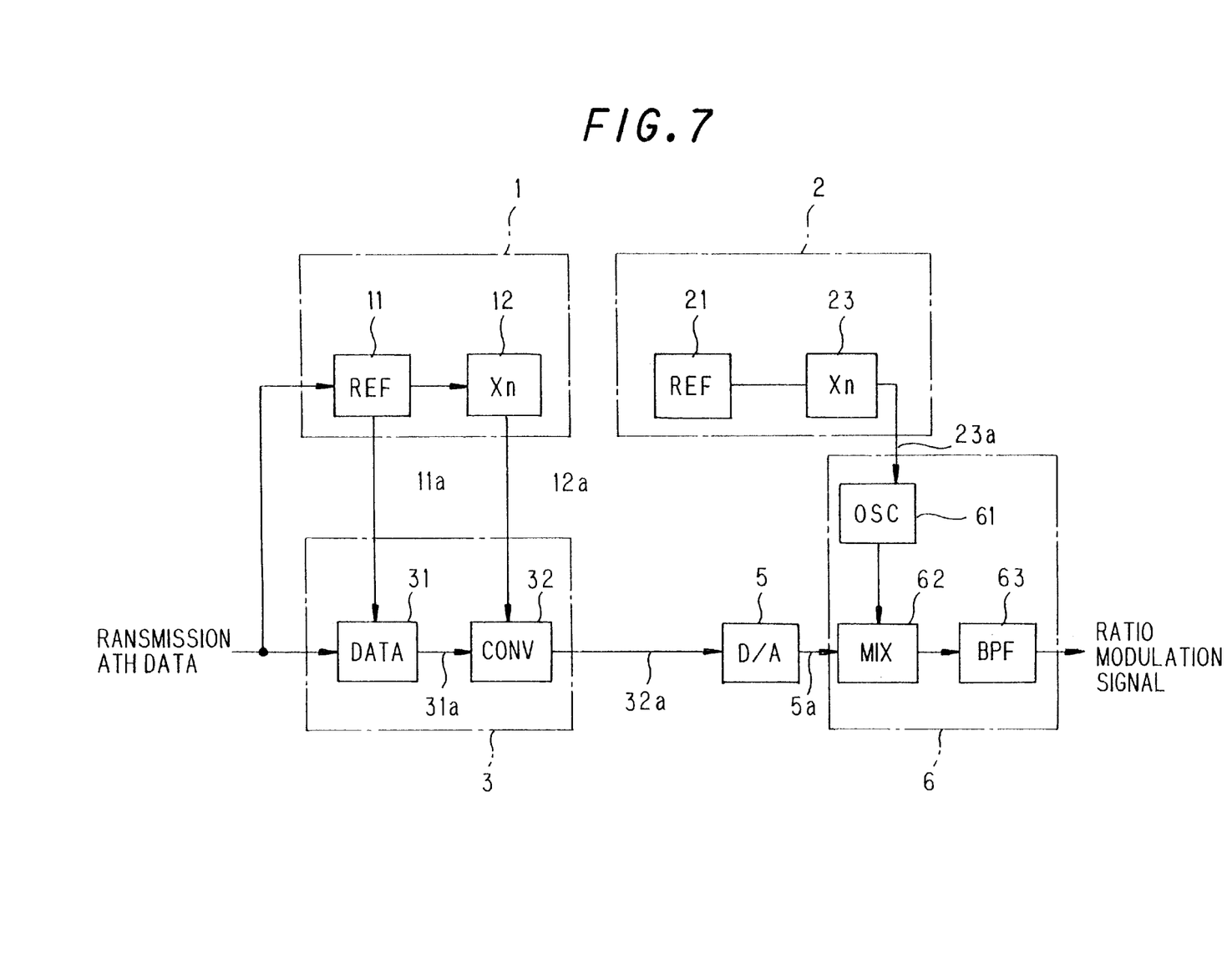
FIG. 7 is a block diagram explaining a prior art.

FIG. 7 is a block diagram of a structural example of a base station in a conventional radio communication system of the same sort. In FIG. 7, a digital data such as sounds, images, or texts transmitted from a switching center that is not shown in figures via a wire transmission path is inputted, the transmitted data is modulated by a preset modulating method, the modulation signal is converted into a radio frequency, and the signal is radio-transmitted to a mobile device that is not shown in the figures.

In FIG. 7, transmission path data transmitted from the switching center via a digital transmission network are inputted to a data generating portion 3 and a transmission path frequency reference clock producing portion 1. The transmission path data are, as is described above, sound, image, or text data, and are data digitized and formatted in a predetermined form.

The transmission path frequency reference clock producing portion 1 extracts a transmission timing of the transmitted digital data (a reference clock signal) from the inputted transmission path data by using a transmission timing generator 11 with a method such as clock extraction, and sends the extracted transmission timing 11a to the data generating portion 3. Moreover, the transmission timing generator 11 also sends the reference clock signal to a dividing/multiplying device 12 for implementing processes such as multiplying or dividing as the need arises. The multiplied or divided output 12a is sent to a data converter 32.

A data generating portion is composed of a data generator 31 and a dada converter 32, both for decoding the transmission path data so as to convert the data into a data system to be modulated into a radio modulation signal. The data system is outputted from the data generator 31 as digital data 31a, and is sent to the data converter 32 at a timing of the transmission timing signal 11a. The data converter 32 orthogonal-modulates the obtained digital data, converts its frequency into a radio intermediate frequency (IF frequency) (32a), and sends the data to a D/A converter 5. The D/A converter 5 produces a radio IF modulation signal 5a converted into the IF frequency on the basis of the inputted data. Although functions such as wave-shape formation or band limitation that are necessary for transmitting codes are actually added to the D/A converter 5, they are not particularly shown in the figures. The generated radio IF modulation signal 5a is inputted to a frequency converting portion 6.

A frequency converting portion 6 is composed of a local oscillator 61 to which a PLL (phase locked loop) technique is applied, a mixer 62, and a filter (BPF) 63. It produces the radio frequency signal at the mixer 62 on the basis of a local oscillation signal generated by the local oscillator 61, removes unnecessary waves from the signal by using the filter 63, and then outputs the radio frequency signal to a radio circuit.

The digital PLL technique, which can provide a frequency according to a voluntary dividing step from a reference frequency generator 21 in accordance with the inputted digital data, is applied to the local oscillator 61. The explanation thereof is omitted since the technique is well known. The local oscillator 61 produces the local oscillation signal synchronizing with the reference frequency signal 23a outputted from the reference frequency generating portion 2. The reference frequency generating portion 2 includes the reference signal generator 21 and the dividing/multiplying device 23 for dividing or multiplying the reference signal as the need arises.

In FIG. 7, a radio intermediate frequency modulation signal (radio IF modulation signal) 5a being a base of a radio modulation signal 63a is directly produced by a D/A converter 5. The signal 5a is mixed with a local oscillation frequency oscillated by a local oscillator 61 at a mixer 62, and becomes a radio modulation signal 63a. At this time, frequency stability of the radio modulation signal 63a depends on a reference signal generated by a reference frequency generator 21 and a reference signal generated by a reference clock producing portion 1 synchronizing with a clock obtained by clock-extraction from transmitted data at a transmission path.

Normally, according to the fact that the transmission path, which is sufficient to refer data during a voluntary timing, and the radio frequency, which is required to have stability based on Electric Wave Law for strongly restricting illegal radiation, are inputted and outputted respectively, it is natural that, concerning the stability of the frequencies, precision of the reference frequency generator 21 is higher than that of the transmission timing generator 11 in comparison.

According to this, the frequency stability of the radio modulation signal 63a is largely dominated by a reference clock producing portion 1 so that the frequency stability is deteriorated. It is very important point how the frequency stability of the part can be improved, or how the frequency difference can be compensated in improving the frequency stability of the radio modulation signal 63a.

SUMMARY OF THE INVENTION

Here, it is object of the present invention to provide a radio communication apparatus that can improve the stability of the radio frequency, and a radio frequency correcting method thereof.

A radio communication apparatus according to the present invention includes:

an intermediate frequency modulation signal producing means for producing a modulation signal at an intermediate frequency out of transmitted data from a transmission path by using the first reference signal synchronizing with the data;

a radio frequency converting means for converting the intermediate frequency modulation signal into a radio frequency by using the second reference signal being more stabile than the first reference signal; and a radio frequency correcting means for detecting a frequency difference between the first reference signal and the second reference signal, and for correction-controlling the radio frequency at the radio frequency converting means in accordance with the frequency difference.

Moreover, the radio frequency correcting means includes a means for detecting the frequency difference of the first reference signal on the basis of the second reference signal, and a means for correction-controlling a frequency of a local oscillation signal at the radio frequency converting means in accordance with the frequency difference. The intermediate frequency modulation signal producing means includes a modulating means for modulating the transmitting data with an orthogonal modulating method by using the first reference signal.

A radio communication apparatus according to the present invention includes:

a buffer means for temporarily storing transmitted data from a transmission path synchronously with the first reference signal;

a reference signal generating means for generating the second reference signal being more stabile than the first reference signal;

an intermediate frequency modulation signal producing means for reading-out data from the buffer means synchronously with the second reference signal so as to produce a modulation signal at an intermediate frequency out of the read-out data by using the second reference signal; and a radio frequency converting means for converting the intermediate frequency modulation signal into a radio frequency by using the second reference signal. The intermediate frequency modulation signal producing means includes a modulating means for modulating the transmitted data with an orthogonal modulating method by using the second reference signal.

A radio frequency correcting method according to the present invention is for a radio communication apparatus designed so as to convert transmitted data from a transmission path into a modulation signal at an intermediate frequency by using the first reference signal synchronizing with the data, and to convert the intermediate frequency modulation signal into a radio frequency by using the second reference signal being more stabile than the first reference signal, which includes a radio frequency correcting means for detecting a frequency difference between the first reference signal and the second reference signal, and for correction-controlling the radio frequency at the radio frequency converting means in accordance with the frequency difference.

Moreover, the radio frequency correcting means includes a means for detecting the frequency difference of the first reference signal on the basis of the second reference signal, and a means for correction-controlling a frequency of a local oscillation signal for the radio frequency conversion in accordance with the frequency difference. The intermediate frequency modulation signal results from modulating the transmitted data with an orthogonal modulating method by using the second reference signal.

Another radio frequency correcting method according to the present invention is for a radio communication apparatus designed so as to convert transmitted data from a transmission path synchronous with the first reference signal into a modulation signal at an intermediate frequency, and to convert the intermediate frequency modulation signal into a radio frequency by using the second reference signal being more stabile than the first reference signal, which includes:

a buffer means for temporarily storing the transmitted data synchronously with the first reference signal;

an intermediate frequency modulation signal producing means for reading-out data from the buffer means synchronously with the second reference signal so as to produce a modulation signal at an intermediate frequency out of the read-out data by using the second reference signal; and a radio frequency converting means for converting the intermediate frequency modulation signal into the radio frequency by using the second reference signal. The intermediate frequency modulation signal results from modulating the transmitted data with an orthogonal modulating method by using the second reference signal.

The effects of the present invention will be described. In a radio system for producing a radio carrier synchronizing with the transmission path frequency of the digital data transmitted from a wire digital transmission path and so on, an influence of the difference of the transmission path frequency that obstructs the stability of the radio carrier frequency is compensated as frequency offset of a signal transmitted from the radio station on the basis of the differential frequency by comparing the difference with the high-stability radio reference clock, and detecting the differential frequency. Moreover, as another example, the influence of the difference of the transmission path frequency is compensated by a method of temporarily accumulating by the buffer the digital data transmitted through the transmission path, and generating the radio carrier by reading out the data while re-transmitting it at the timing of the high-stability radio reference clock.

DESCRIPTION OF THE PREFERRED EMBODIMENTS

Figure 1:
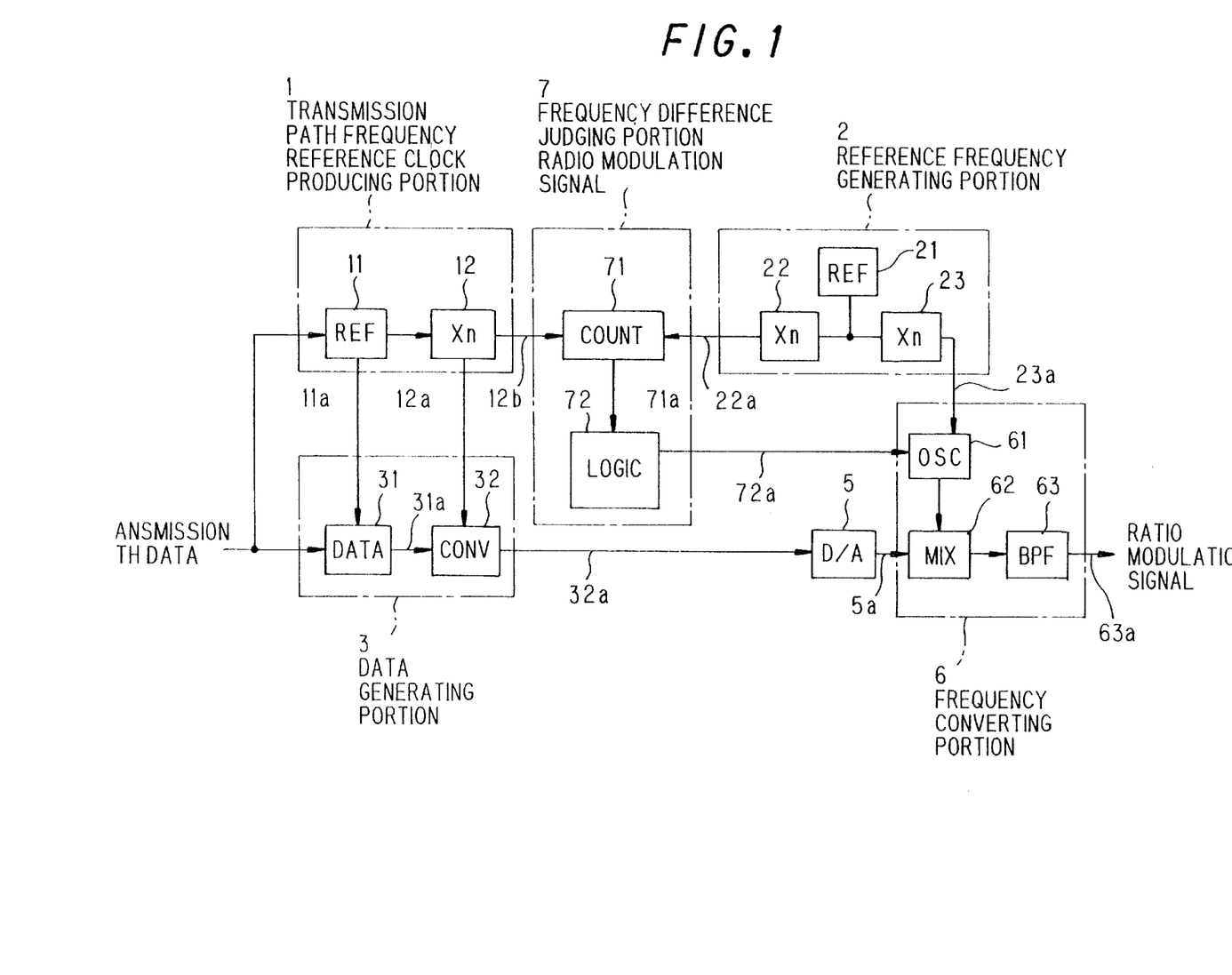
FIG. 1 is a block diagram of an embodiment of the present invention.

Hereinafter, a preferred embodiment of the present invention will be explained with reference to the accompanied drawing. FIG. 1 is a block diagram of the embodiment of the present invention, and the same codes are given to the parts that coincide with those in FIG. 7. As see in FIG. 1, an embodiment of the present invention is composed of a transmission path frequency reference clock producing portion 1, a reference frequency generating portion 2, a data generating portion 3, a frequency converting portion 6, and a frequency difference judging portion 7, and it is a block diagram to which a frequency difference judging portion 7 is added comparing to FIG. 7.

In the frequency difference judging portion 7, a frequency of a transmission path frequency reference clock produced by a transmission timing generator 11 and a frequency from a reference frequency generator 21 are compared to each other and are counted at a counter 71, and a difference between an oscillation frequency at the transmission timing generator 11 and an oscillation frequency at the reference frequency generator 21 is detected. Then, a frequency appointing signal for implementing compensation with a frequency offset amount in the opposite direction to the frequency difference direction generated from the transmission timing generator 11 (for example, if it is +100 Hz, the offset amount is −100 Hz) is transmitted to a local oscillator 61 so that frequency stability of a radio modulation signal 63a can be improved.

A detailed explanation will be given of FIG. 1. Transmission path data transmitted from a switching center that is not shown in figures via a digital transmission network are inputted to the data generating portion 3 and the transmission path frequency reference clock producing portion 1. Here, the transmission path data are sound data, image data, text data, and so on that are digitized and formatted in a predetermined format.

The transmission path frequency reference clock producing portion 1 extracts the transmission timing of the digital data transmitted by using a technique such as clock extraction from the inputted transmission path data by using the transmission timing generator 11, and sends the transmission timing 11a to the data generating portion 3a while sending the transmission path frequency reference clock 1 to a dividing/multiplying device 12 for implementing a process such as multiplying or dividing as the need arises. The dividing/multiplying device 12 outputs the transmission timings 12a and 12b, both result from dividing or multiplying the inputted signal, to a data converter 32 and the counter 71 respectively. Whether the inputted signal is divided or multiplied is decided at the time of designing. Although the transmission timings 12a and 12b are indicated separately for its convenience, the same timing may be used in the case where the relation between the frequencies meets the design condition.

The data generating portion 3 is composed of a data generator 31 and a data converter 32 both for decoding the transmitted transmission path data and for converting it into a data system to be modulated to the radio modulation signal. The data system is outputted as the digital data 31a by the data generator 31, and is sent to the data converter 32 at the timing of the transmission timing 11a. The data converter 32 orthogonal-converts the obtained digital data while producing the data 32a whose frequency is to be converted into a radio intermediate frequency (IF frequency), and transmits the data to the D/A converter 5.

The D/A converter 5 produces a radio IF modulation signal 5a converted into the IF frequency on the basis of the inputted data. Although functions such as wave-shape formation or band limitation that are necessary for transmitting codes are actually added to the D/A converter 5, they are not particularly shown in the figures. The generated radio IF modulation signal 5a is inputted to a frequency converting portion 6. A frequency converting portion 6 is composed of a local oscillator 61 to which a PLL technique is applied, a mixer 62, and a filter 63 at least. It further converts the frequency of the radio frequency signal at the mixer 62 on the basis of a local oscillation signal generated by the local oscillator 61, removes unnecessary waves from the signal by using the filter 63, and then outputs the radio frequency signal to a radio circuit.

The digital PLL technique, which can provide a frequency according to a voluntary dividing step from a reference frequency generator 21 in accordance with the inputted digital data, is applied to the local oscillator 61. The explanation thereof is omitted since the technique is well known in the concerned field.

Figure 2:
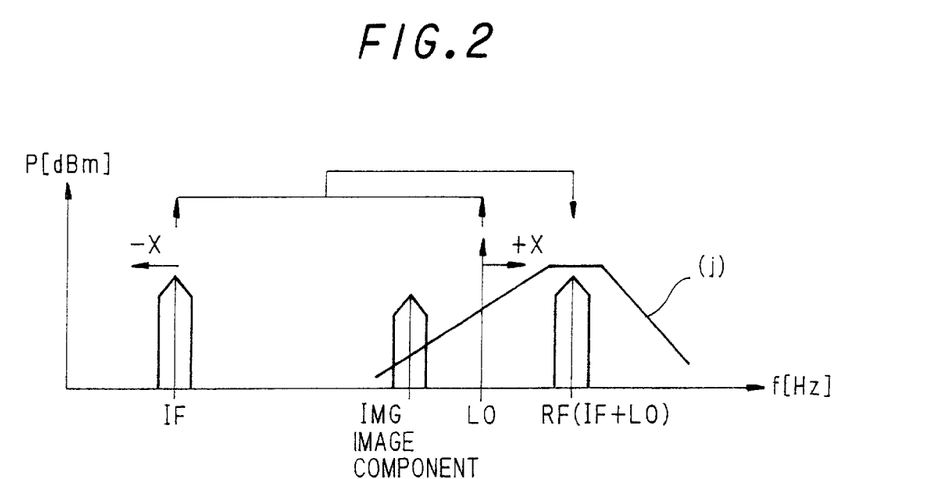
FIG. 2 is a drawing explaining operation of the embodiment of the present invention.

FIG. 2 explains operation related to an arrangement of the frequencies during the frequency converting process. The radio IF modulation signal 5a is located at the frequency indicated as "IF" in the figure, but the signal is converted into the radio modulation signal 63a at the frequency "RF" by being mixed with the frequency at the frequency "LO" of the local oscillator 61 in the mixer 62. Remained components of unnecessary components "IM" or "LO" generated at the time of mixing are removed by the filter 63 (characteristics indicated as (j) in the figure).

The reference frequency generating portion 2 supplies a stabile reference clock to the frequency converting portion 6. The reference frequency generating portion 2 includes the reference frequency generator 21 and the dividing/multiplying devices 22 and 23 for implementing the process such as multiplying or dividing as the need arises. The dividing/multiplying devices 22 and 23 sends the reference timings 22a and 23a, both result from dividing or multiplying the inputted signal, to the local oscillator 61 and the frequency difference judging portion 7 respectively. Whether the inputted signal is divided or multiplied is described at the time of designing. Although the reference timings 22a and 23a are indicated separately for its convenience, the same timing may be used in the case where the relation between the frequencies meets the design condition.

The frequency difference judging portion 7 is composed of the counter 71 and a logic portion 72 for implementing a logic process, and the reference timing 22a having precision that stabilizes the radio frequency and the transmission timing 12b according to the stability of the transmission path are inputted to the counter 71. As an example, the counter 71 measures how many times the transmission timing 12b is counted during a voluntary cycle interval of the reference timing 22a. The counted number 71a is inputted to the logic portion 72 for implementing the logic process. The logic portion judges whether the transmission path clock, that is the transmission timing 12b, is advanced (its frequency is higher) or behind (its frequency is lower) comparing with the reference timing 22a in accordance with the obtained result of the counted number 71a.

When the frequency is higher, the offset data for lowering the frequency oscillated by the local oscillator 61 is sent. The offset data is the data for a PLL synthesizer for judging how much difference appears in the frequency of the radio modulation signal 63a in accordance with the transmission timing 12b, and for making the local oscillating portion 61 to generate the difference in the opposite direction to the judged difference. For example, when it is judged that the frequency of the radio modulation signal 63a transferred to the lower direction, the offset data for increasing the frequency oscillated by the local oscillator 61 is sent.

An explanation will be given with reference to FIG. 2. When the frequency of the transmission timing 12b is off in the lower direction (that is to say, the frequency "IF" of the radio IF signal shown in FIG. 2 is off in the direction −x), the frequency "RF" of the radio modulation signal 63a can be sustained by shifting the frequency "LO" oscillated by the local oscillator 61 in the direction +x.

In general, the precision of the reference frequency generator 21 is better than the precision of the transmission timing generator 11 concerning the stability of the frequencies since it is sufficient for the wire transmission path that the data can be referred during the voluntary timing, while the stability based on Electric Wave Law for strongly restricting illegal radiation is required for the wire frequency. Accordingly, as is described above, the required stability of the frequency of the radio modulation signal can be kept by compensating a differential frequency detected from comparison of the frequency difference of the transmission path with the reference timing 22a for determining the radio frequency by using the frequency generated by the local oscillating portion.

Figure 3A:
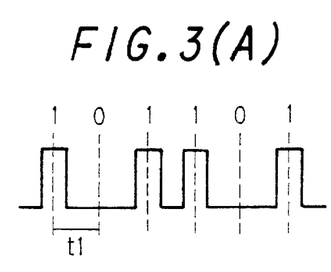
FIG. 3 is a part of a drawing explaining operation of a data converting portion 32 according to the embodiment of the present invention.
Figure 3B:
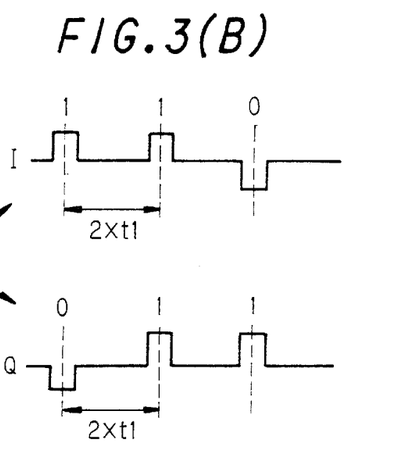
Figure 3C:
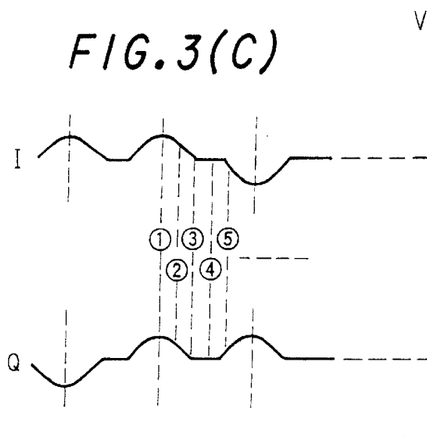
Figure 3D:
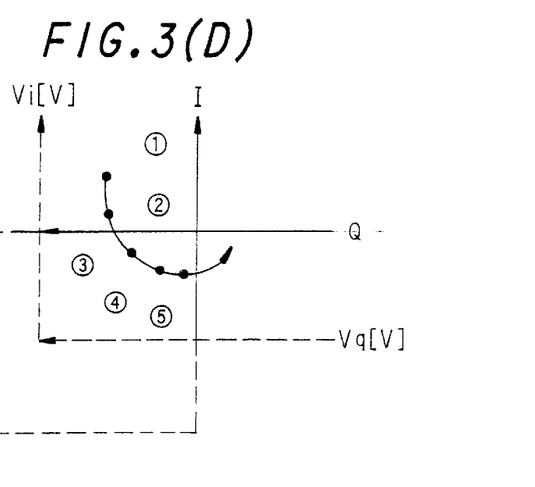
Figure 3E:
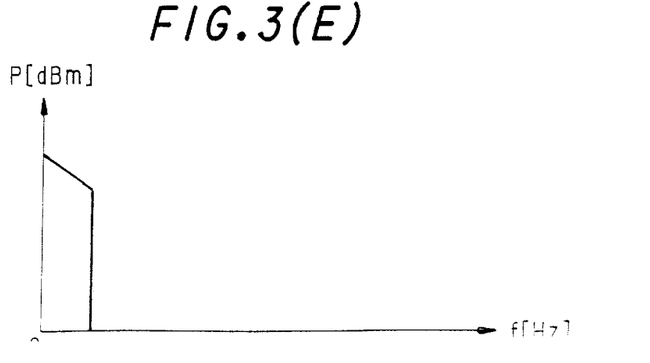
Figure 4A:
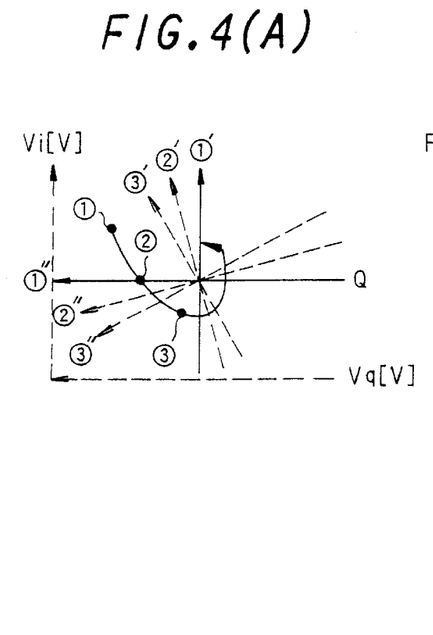
FIG. 4 is a part of the drawing explaining the operation of the data converting portion 32 according to the embodiment of the present invention.

Next, an explanation will be given of the operation of the data converter 32 in FIG. 1 with reference to FIG. 3 to FIG. 5. FIG. 3 (a) shows the digital data 31a in the data generator 31. Here, the data are expressed as consecutive serial data. Reference numbers t1 in the figure indicates a cycle of the transmission timing 11a. Next, the operation of the data converter 32 is shown. The data system inputted to the data converter 32 are converted into a signal system based on a selected modulating method. FIG. 3 (b) shows an example where the serial data are separated to an in-phase component (I) and an orthogonal component (Q) by an orthogonal modulating method in the QPSK modulating method. The I and Q will be expressed later by using a plane of vectors being orthogonal to each other.

The separated data system is transformed into a wave shape (FIG 3 (c)) subjected to wave-shape formation (filtering) based on the selected modulating method. Normally, the transformation is implemented by applying impulse respond of a systemized data impulse to polarities of 0 and 1 of the data. In order to produce the wave shape accurately by using the D/A converter 5, it is necessary to produce the wave shape at a timing severalfold of the transmission timing 11a. The timing is indicated as the reference timings 22a and 12a in the figure. According to this, the wave shape is plotted as a vector amount on an I/Q plane based on the QPSK method (FIG. 3 (d)), and a vector locus being a base of the radio intermediate frequency modulation signal (radio IF modulation signal) 5a is drawn.

①, ②, ③ . . . indicate a voltage locus transformed into timings by the reference timing 22a or 12a. However, under this state, the wave shape on a frequency spectrum becomes a direct-current spectrum based on a frequency 0 Hz as is shown in FIG. 3(e), and it cannot be the radio intermediate frequency modulation signal (radio IF modulation signal) 5a. Thus, an axis of the I/Q plane for plotting the voltage locus is rotated in a condensive direction (a direction to which the phase or frequency is advancing) so that the voltage locus can be plotted.

However only, the wave shape in FIG. 3 (c) needs to be plotted as a voltage wave shape based on the I/Q axis. Thus, rotation speeds of the vector loci ①, ②, ③ . . . increase (FIG. 4 (a)). That is to say, the I/Q axis at a signal point of ① is ①', ①'', the I/Q axis at a signal point of ② is ②', ②'', and the I/Q axis at a signal point of ③ is ③', ③'' (followings are omitted). By implementing the rotation of the I/Q axis "IF" times per second, the frequency spectrum becomes the radio intermediate frequency modulation signal 5a (a signal whose frequency is shifted by "IF" Hz) shown in FIG. 4(b).

Figure 4B:
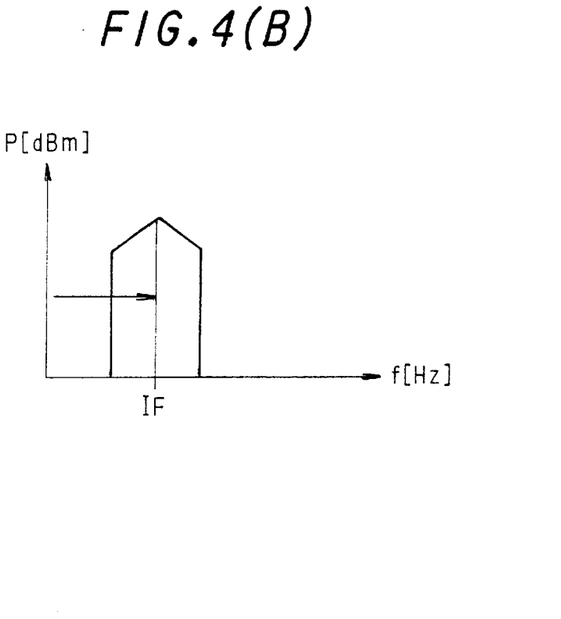
Figure 5A:
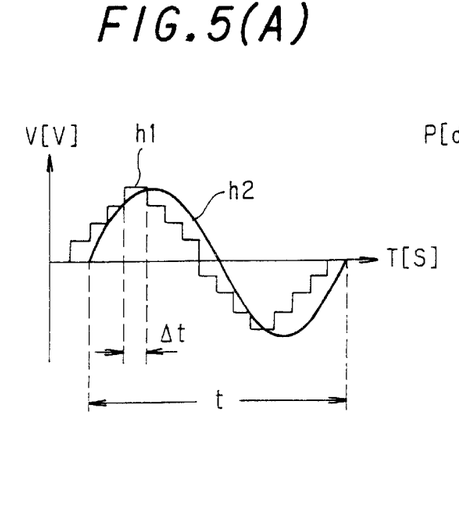
FIG. 5 is a part of the drawing explaining the operation of the data converting portion 32 according to the embodiment of the present invention.
Figure 5B:
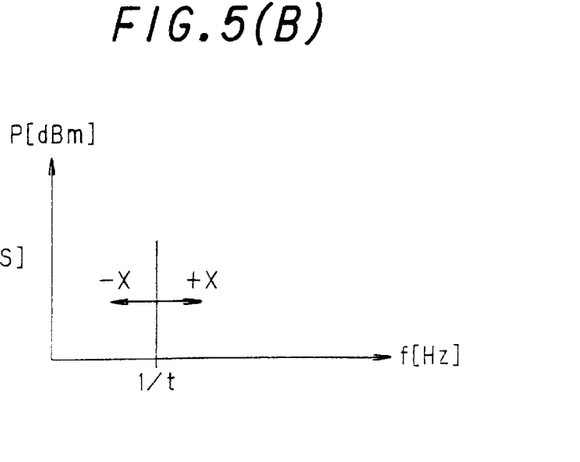

Production of the IF frequency at an output terminal of the D/A converter 5 will be explained. The signal of the frequency spectrum shown in FIG. 5(b) is obtained by producing the wave shape shown in FIG. 5(a). The wave shape of the signal shown in FIG. 4(b) is the phase component of a cycle t and amplitude of the whole wave shape shown in FIG. 5(a) temporally converted on the basis of modulation principle. In FIG. 5(a), h1 indicates a discrete voltage wave shape originally outputted by the D/A converter 5 at a signal timing Δt (equivalent to the reference timing 22a or 12a), and h2 indicates the wave shape results from graduation of clock components. An explanation has been given on the assumption that the D/A converter 5 includes a graduation function. In this manner, the data converter 32 produces the radio IF modulation signal 5a.

When such a structure is considered, it is understood that the reference timing 22a or 12a becomes a main factor for determining the frequency difference of the produced radio IF modulation signal 5a. In FIG. 5(a), the timing difference ±x of the reference timing 22a or 12a is added to the timing of Δt (Δt±x), so as to generate the difference equivalent to −x or +x on the frequency spectrum in FIG. 5(b). The embodiment shown in FIG. 1 is designed so that the frequency difference −x generated at the radio IF modulation signal 5a (frequency indicated as IF) shown in FIG. 2 can be compensated by the offset of the oscillation signal at the local oscillator 61 in a +x direction.

In this manner, in this embodiment, the difference generated by the reference clock producing portion 1 dominating the frequency stability of the radio modulation signal 63a is compared with the signal at the reference signal generator 21 so that the difference between them is extracted, and then the difference is compensated by using the frequency oscillated by the local oscillating portion 61. By this operation, the frequency stability of the radio modulation signal 63a can be improved.

Figure 6:
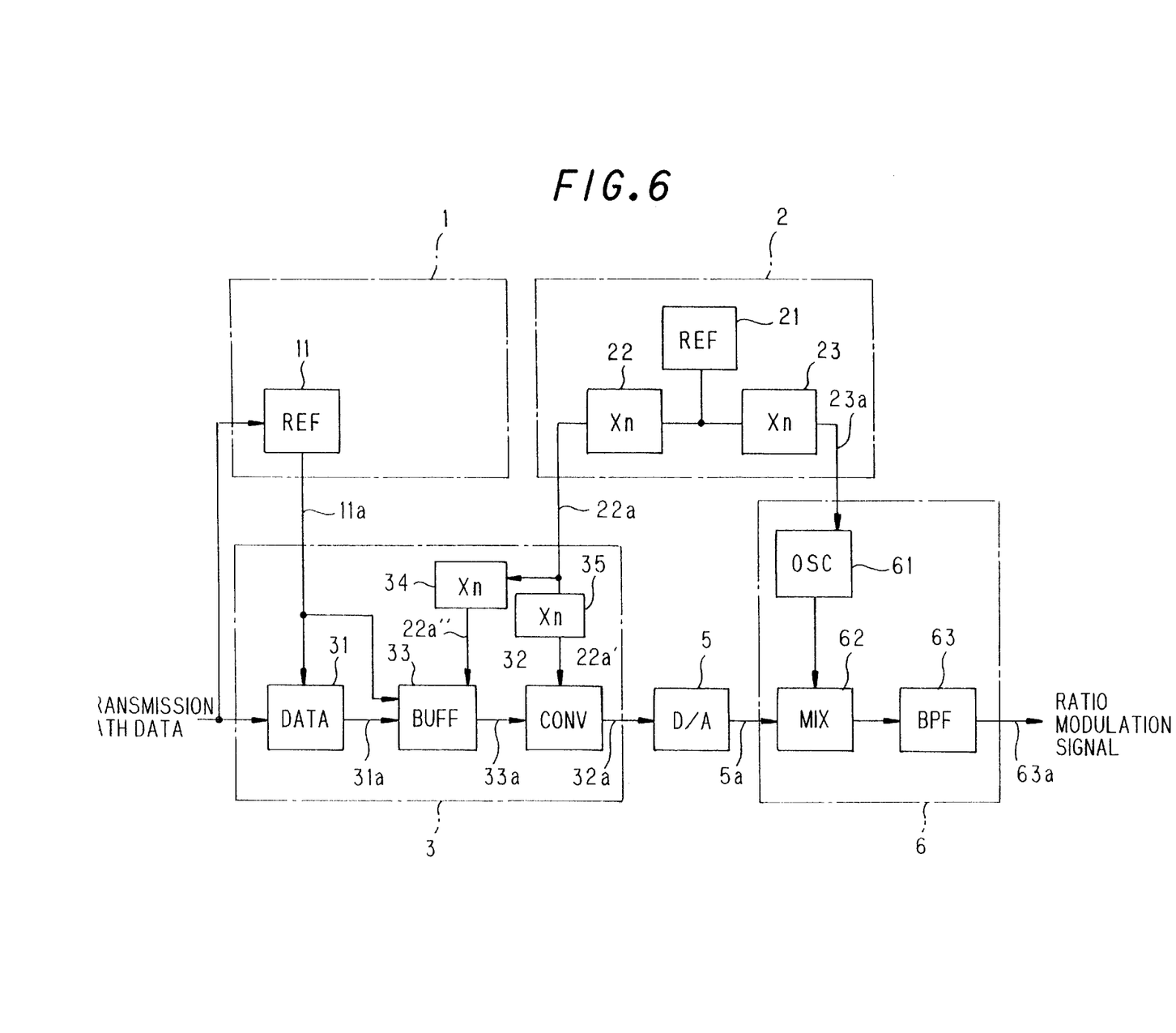
FIG. 6 is a block diagram of another embodiment of the present invention.

FIG. 6 is a block diagram of another embodiment of the present invention. The same codes are given to the parts that coincide with those in FIG. 1, and the explanations for FIG. 1 are omitted. This embodiment suggests the method of improving the frequency stability of the radio modulation signal 63a by temporarily accumulating the data for modulating the radio modulation signal 63a to the data buffer 33 at the timing of the transmission timing generator 11, extracting the accumulated data at the timing generated by the reference frequency generating portion 21, and producing the radio IF modulation signal 5a.

That is to say, the digital data 31a of the data generator 31 that are sent in accordance with the transmission timing 11a produced at the transmission timing 11 is temporarily accumulated to the data buffer 33. The data buffer 33 can be composed of RAM, ROM, etc. that are all means for temporarily keeping the data. The digital data 31a taken in the data buffer 33 is now sent to the data converter 32 at the read-out timing of the reference timing 22a.

At this time, inputs to the data buffer 33 are classified and processed at the transmission timing 11a being the write-in timing and the reference timing 22a being the read-in timing. It is necessary to implement the process to prevent the write-in timing and read-in timing from being issued at the same time. In general, there are often taken the structure where the data buffer 33 is transformed into two buffers, for example, the first data buffer and the second data buffer so as to prevent them from crashing to each other, and the reading-out and the writing-in are processed in the different buffers. However, the explanation thereof is omitted here.

Moreover, the timing converted into a voluntary timing by the dividing/multiplying device 34 for implementing conversion into the timing being suitable for the modulating method may be used as the reference timing 22a being the read-in timing. The data converter 32 orthogonal-converts the obtained digital data at the reference timing 22a synchronizing with the reference timing 22a being the read-in timing while producing the data 32a whose frequency is to be converted into the radio intermediate frequency (IF frequency), and transmits the data to the D/A converter 5. The timing converted into a voluntary timing by the dividing/multiplying device 35 for implementing conversion into the timing being suitable for the modulating method may be used as a orthogonal-conversion timing in a similar manner to the read-in timing of the data buffer 33.

In this manner, the frequency stability of the radio modulation signal 63a can be improved by temporarily accumulating the data to the buffer 33 so that the difference generated by the reference clock oscillating portion 1 dominating the frequency stability of the radio modulation signal 63a is not included, and by re-producing the data at the signal timing of the reference signal generating portion 21.

This embodiment is characterized in preventing the frequency differences (−x and +x) shown in FIG. 5(b) from being produced by previously using the reference timing 22a with higher stability in the data converter 32. That is to say, by temporarily taking the data itself including the frequency difference in the data buffer 33, it is realized that the influence of the difference is excluded, and re-timing is implemented at the reference timing with the high stability.

As is explained above, the present invention provides following effects. Tat is, the first effect is to improve frequency stability of a radio modulation by detecting a frequency difference to be generated at a generated radio IF modulation signal, and compensating the difference in a process of converting the difference into a radio modulation signal (the process of moving a frequency oscillated by a local oscillating portion in the direction for compensation toward the opposite direction).

Moreover, the second effect is to improve the frequency stability of the radio modulation signal by adopting a design that has no frequency difference generated by temporarily accumulating the data to a buffer so that the generated frequency difference becomes invisible, and by implementing operation of generation and modulation by using a high-stability clock.

What is claimed is:

1. A radio communication apparatus comprising:
   an intermediate frequency modulation signal producing means for producing a modulation signal at an intermediate frequency out of transmitted data from a transmission path by using the first reference signal synchronizing with the data;
   a radio frequency converting means for converting the intermediate frequency modulation signal into a radio frequency by using the second reference signal being more stabile than the first reference signal; and
   a radio frequency correcting means for detecting a frequency difference between the first reference signal and the second reference signal, and for correction-controlling the radio frequency at the radio frequency converting means in accordance with the frequency difference.

2. A radio communication apparatus according to claim 1 in which the radio frequency correcting means comprises a means for detecting the frequency difference of the first reference signal on the basis of the second reference signal, and a means for correction-controlling a frequency of a local oscillation signal at the radio frequency converting means in accordance with the frequency difference.

3. A radio communication apparatus according to claim 1 in which the intermediate frequency modulation signal producing means comprises a modulating means for modulating the transmitted data with an orthogonal modulating method by using the first reference signal.

4. A radio communication apparatus comprising:
   a buffer means for temporarily storing transmitted data from a transmission path synchronously with the first reference signal;
   a reference signal generating means for generating the second reference signal being more stabile than the first reference signal;
   an intermediate frequency modulation signal producing means for reading-out data from the buffer means synchronously with the second reference signal so as to produce a modulation signal at an intermediate frequency out of the read-out data by using the second reference signal; and
   a radio frequency converting means for converting the intermediate frequency modulation signal into a radio frequency by using the second reference signal.

5. A radio communication apparatus according to claim 4 in which the intermediate frequency modulation signal producing means comprises a modulating means for modulating the transmitted data with an orthogonal modulating method by using the second reference signal.

6. A radio frequency correcting method for a radio communication apparatus designed so as to convert transmitted data from a transmission path into a modulation signal at an intermediate frequency by using the first reference signal synchronizing with the data, and to convert the intermediate frequency modulation signal into a radio frequency by using the second reference signal being more stabile than the first reference signal, which comprises a radio frequency correcting means for detecting a frequency difference between the first reference signal and the second reference signal, and for correction-controlling the radio frequency at the radio frequency converting means in accordance with the frequency difference.

7. A radio frequency correcting method according to claim 6 in which the radio frequency correcting means comprises a means for detecting the frequency difference of the first reference signal on the basis of the second reference signal, and a means for correction-controlling a frequency of a local oscillation signal for the radio frequency conversion in accordance with the frequency difference.

8. A radio frequency correcting method according to claim 7 in which the intermediate frequency modulation signal results from modulating the transmitted data with an orthogonal modulating method by using the second reference signal.

9. A radio frequency correcting method for a radio communication apparatus designed so as to convert transmitted data from a transmission path synchronous with the first reference signal into a modulation signal at an intermediate frequency, and to convert the intermediate frequency modulation signal into a radio frequency by using the second reference signal being more stabile than the first reference signal, which comprises:
   a buffer means for temporarily storing the transmitted data synchronously with the first reference signal;
   an intermediate frequency modulation signal producing means for reading-out data from the buffer means synchronously with the second reference signal so as to produce a modulation signal at an intermediate frequency out of the read-out data by using the second reference signal; and
   a radio frequency converting means for converting the intermediate frequency modulation signal into the radio frequency by using the second reference signal.

10. A radio frequency correcting method according to claim 9 in which the intermediate frequency modulation signal results from modulating the transmitted data with an orthogonal modulating method by using the second reference signal.

* * * * *